(12) United States Patent
Smith

(10) Patent No.: US 9,385,321 B1
(45) Date of Patent: Jul. 5, 2016

(54) REAL-SPACE CHARGE-TRANSFER DEVICE AND METHOD THEREOF

(71) Applicant: Don D. Smith, Round Rock, TX (US)

(72) Inventor: Don D. Smith, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 20 days.

(21) Appl. No.: 14/573,891

(22) Filed: Dec. 17, 2014

(51) Int. Cl.
*H01L 29/66* (2006.01)
*H01L 47/02* (2006.01)
*H03K 5/04* (2006.01)
*H03K 5/1252* (2006.01)

(52) U.S. Cl.
CPC ............... *H01L 47/026* (2013.01); *H03K 5/04* (2013.01); *H03K 5/1252* (2013.01)

(58) Field of Classification Search
USPC .................................................. 257/187–201
See application file for complete search history.

(56) References Cited

U.S. PATENT DOCUMENTS

| | | | | |
|---|---|---|---|---|
| 4,903,092 A * | 2/1990 | Luryi | ................... | H01L 27/0605 257/183.1 |
| 5,055,891 A * | 10/1991 | Moll | ................... | H01L 29/7606 257/201 |
| 8,119,032 B2 * | 2/2012 | Gordon | ................... | B82Y 10/00 252/502 |
| 8,481,421 B2 * | 7/2013 | Goddard | ................... | B82B 1/00 438/618 |
| 2003/0035917 A1 * | 2/2003 | Hyman | ................... | B41M 1/30 428/67 |
| 2007/0290287 A1 * | 12/2007 | Freedman | ............. | B82Y 30/00 257/443 |
| 2010/0108882 A1 * | 5/2010 | Zewail | ................... | H01J 37/22 250/307 |

OTHER PUBLICATIONS

Shoji, M., "Functional Bulk Semiconductor Oscillators," IEEE Transactions on Electron Devices, ED-14, No. 9, Sep. 1967; pp. 535-546.

Smith, Don, "Room-temperature semiconductor Smith-Purcell terahertz sources," Applied Physics Lett. 98(6), Feb. 2011.

* cited by examiner

*Primary Examiner* — Brandon S Cole

(57) ABSTRACT

A real-space charge-transfer device is disclosed. In particular, a Gunn diode is disclosed having a conductive structure fabricated overlying its active region. A secondary signal, other than the normal Gunn diode signal, is generated by the Gunn diode based upon a characteristic of the overlying conductive structure. For example, when the conductive structure is a grate having N teeth the secondary signal will have N secondary oscillation cycles that occur during the duration of a single normal Gunn diode oscillation cycle.

20 Claims, 10 Drawing Sheets

REAL-SPACE CHARGE-TRANSFER DEVICE AND METHOD THEREOF

BACKGROUND

1. Field of the Disclosure

The present application is related to electronic devices, and in particular to real-space charge-transfer devices and methods based on real-space charge transfer devices.

2. Related Art

Real-space charge-transfer devices, such as a Gunn diode, can be used to generate microwaves or millimeter waves. Such a device has an active region between an anode and a cathode that can be manufactured using a semiconductor material, such as a compound semiconductor in the case of a Gunn diode. It is the case with such devices that their electron mobility is large in a low electric field (several thousands of $cm^2$ N-sec) and that in response to being exposed to a sufficiently large electric field their electron mobility is decreased as accelerated electrons transit to a band of large effective mass. This decrease in mobility in high electric fields causes a negative differential mobility within their active region that is characterized by the generation of a p-n junction domain that transits across the active region of the device, from the cathode side to the anode side. This domain is referred to as a Gunn domain in Gunn diodes. Once the p-n junction domain completes its transit across the active region of a device, another p-n junction domain is generated and begins its transit across the device. FIG. 1 illustrates a current-time graph illustrating the vibrating current at the anode of a Gunn diode that is the result of this phenomenon. As illustrated, the duration of the Gunn domain is represented by the time labeled $D_{Gd}$, and the period of the vibrating current of the Gunn Domain that results in the normal Gunn oscillation $f_G$ is represented by the time labeled $P_{Gd,osc}$.

The Oscillation frequency of a standard Gunn diode can be determined from the transit distance L of the domain, e.g., the length of the Gunn diode's active region, and the average drift velocity Vd of the electrons in the active region using the equation: ft=Vd/L. Thus, the energy relaxation time of the device, which consists of the time needed for the electron to increase and decrease energy at Γ valley, and the length of the device primarily determine the upper limit of the oscillating frequency in the millimeter wave range. For example, the relaxation time constant of GaAs is such that the upper limit of the oscillating frequency for a Gunn diode is between 60 and 70 GHz (gigahertz).

Efforts to increase the upper frequency limits of Gunn diodes include using compound semiconductor materials having faster relaxation time constants. In addition, the distance of transit has been short, e.g., 1 to 2 μm (micrometers).

In order to implement such efforts, measures have been taken with conventional Gunn diodes for millimeter waves such as employing a vertical diode structure having an anode and cathode at opposing surfaces, to use elements including the active layer of extremely small sizes, having diameters of approximately several tens of μm.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION OF THE DRAWINGS

A real-space charge-transfer device is disclosed herein by way of example in the context of a planar Gunn diode, wherein the Gunn diode is fabricated to have a conductive structure overlying its active region. During operation, the conductive structure, which is passive by virtue of not being actively driven to bias the active region, causes a generated Gunn diode signal to have a secondary output signal in addition to the normal Gunn diode signal. The secondary output signal has a fundamental frequency ($f_0$) that is different from the fundamental frequency of the normal Gunn diode signal. For example, in one embodiment, a conductive structure formed overlying the active region of a Gunn diode having repetitive features, such as a grate structure having a plurality of teeth, causes a secondary output signal that modulates during each normal Gunn oscillation cycle to produce a moving charge image of the grate. For example, a Gunn diode having a grate having N teeth overlying its active region generates an output signal comprising not only the normal Gunn oscillation, but also a secondary signal with N secondary oscillation cycles that correspond to the N teeth. The ability to generate a secondary oscillation allows for the generation of higher frequency signals without having to reduce the length of the Gunn diode. In addition, the frequency characteristics of the secondary oscillation of a Gunn diode can be controlled by changing various characteristics of the overlying conductive layer based upon the requirements of various applications. FIGS. 2-11 disclose particular embodiments of a real-space charge-transfer device having a conductive structure overlying its active region to effectuate this secondary oscillation. It will be appreciated that while the illustrated embodiments are described with reference to a Gunn diode, that similar techniques can apply to any real-space charge-transfer device.

Figure 1:
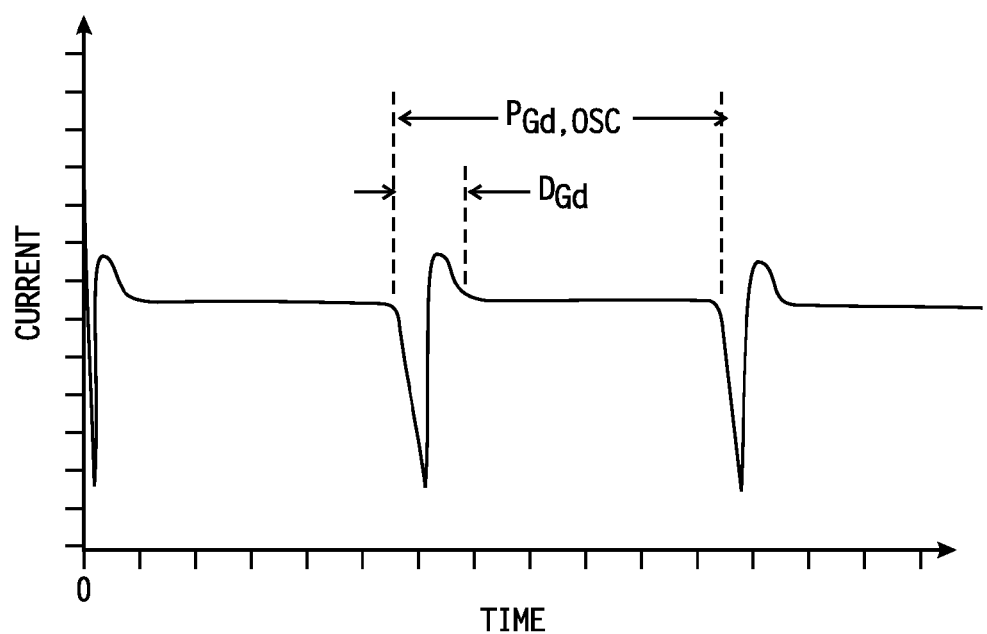
FIG. 1 illustrates a time-current graph of a Gunn diode as is known in the prior art.
Figure 2:
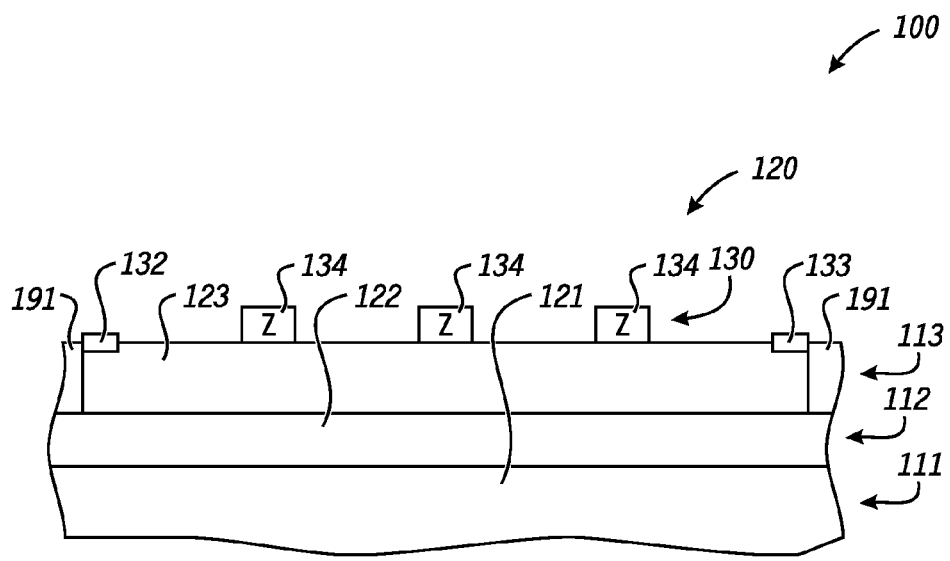
FIG. 2 illustrates a cross-sectional view of a Gunn diode in accordance with a particular embodiment of the present disclosure.
Figure 3:
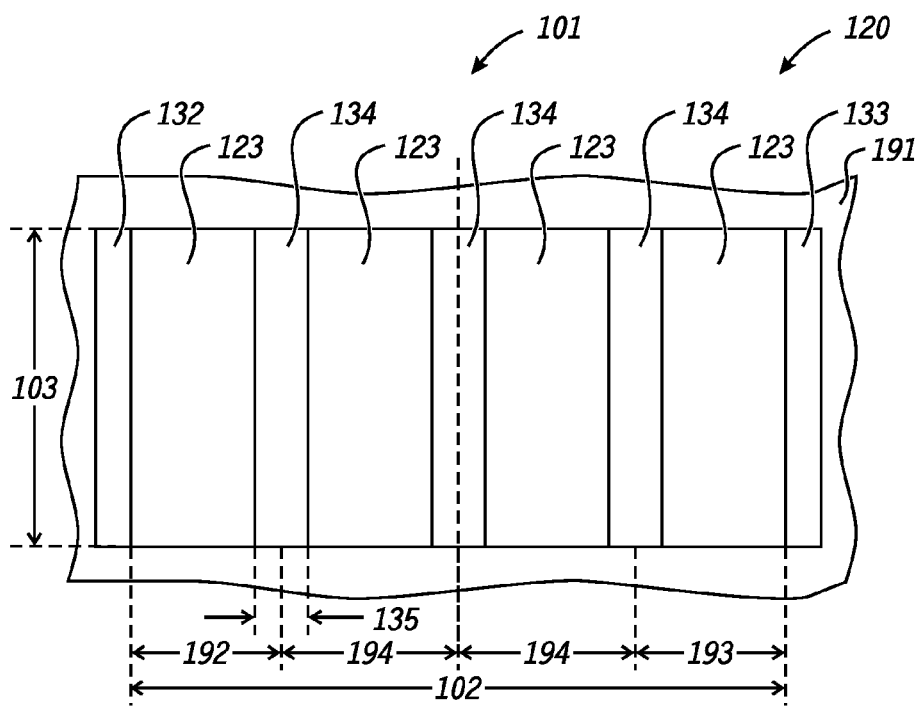
FIG. 3 illustrates a plan view of a Gunn diode in accordance with a particular embodiment of the present disclosure.

FIGS. 2 and 3 illustrate a planar Gunn diode that is disposed at a portion of a workpiece 100 in accordance with a particular embodiment of the present disclosure. In particular, FIG. 2 illustrates a cross-sectional view of a Gunn diode 120 at a location of the workpiece 100, and FIG. 2 illustrates a plan view of the Gunn diode 120. While the portion of workpiece 100 of FIG. 1 only illustrates a Gunn diode 120, it will be appreciated that the workpiece can include other components and features.

Workpiece 100 is presumed to be a wafer at which various features of an integrated circuit device are formed during fabrication of the integrated circuit device, and is illustrated to include levels 111-113, wherein level 111 is the lower-most level of the workpiece, level 113 is the upper-most level where an active layer resides, and level 112 resides between level 111 and level 113. A layer 121 of workpiece 100 is a support layer that resides at level 111 to provide structural support to the workpiece 100. By way of example, it is presumed layer 121 is a semiconductor layer, e.g., Silicon, Germanium, Gallium Arsenide (GaAs), Indium Phosphide (InP), and the like that may be doped or undoped.

A layer 123 of workpiece 100 includes a semiconductor material suitable for acting as the active region of a real-space charge-transfer device. Therefore, layer 123 can be referred to herein as the active layer 123. For a Gunn diode, the active layer 123 can be a compound semiconductor material, such as a III-V or a II-VI semiconductor, an organic semiconductor material, and other semiconductor materials suitable for the purposes described herein. By way of example, it is presumed layer 123 is Indium Phosphide having a thickness of approximately 1 micron that has been doped with an n-type dopant to provide an appropriate conductivity at which to form the active region of a Gunn diode, such as a doping in the range of $1 \times 10^{12}$ ions/cm$^3$ to $1 \times 10^{18}$ ions/cm$^3$.

Layer 122 is an intermediate layer that provides for an appropriate interface with the active layer 123 and the support layer 111. For example, in a particular embodiment where layers 121-123 form a Semiconductor-On-Insulator (SOI) substrate, layer 122 can be a dielectric layer. Alternatively, layer 122 can be a semiconductor layer having a doping concentration that is greater than that of the active layer 123. By way of example, it is presumed layer 122 is a dielectric layer.

An isolation region 139, such as a dielectric region, resides at level 131 that is suitable to electrically isolate the active region 123 from adjacent active regions (not shown) that also reside at level 131 of the workpiece 100. For example, the isolation region 139 can be a shallow-trench isolation structure.

Features 132 and 133 are anode/cathode electrodes of the Gunn diode 120 that are in electrical contact with the active region 123. During operation, by way of example, feature 132 is presumed to be a cathode, referred to as cathode 123, and feature 133 is presumed to be an anode, referred to as anode 123. Typically, the resistivity of the electrodes 132 and 133 is lower than that of the semiconductor material of active region 123. For example, the electrodes 132 and 133 can be a metal silicide, a semiconductor region that is more highly n-doped than the active region 123, e.g., $1 \times 10^{19}$ ions/cm$^2$ or greater, and the like.

A conductive structure is formed overlying the active region 123, e.g., above level 113. As will be described in greater detail below, the conductive structure can abut the active region 123, or a dielectric can reside between the conductive structure and the active region, thereby isolating the conductive portion from the active region 123.

In the illustrated embodiment, the conductive structure is a grate 130 having a plurality of teeth 134. The conductive structure can be a passive structure in that it is electrically isolated from interconnect structures that are capable of being actively driven to provide a bias signal to the tooth. For example, each tooth 134 of the grate 130 is a passive tooth, wherein the term "passive" is intended to indicate that a structure that overlies a portion of the active region of a Gunn diode is electrically isolated from interconnect structures that are capable of being actively driven to provide a bias signal to the tooth. For example, the teeth 134 can be isolated from any interconnect structures, e.g., such as when the upper most surface and side surfaces of tooth 134 are completely surrounded by a dielectric material (not shown), e.g., the teeth are not connected to any interconnect structures. Alternatively, the teeth 134 can be connected to an interconnect structure that is not capable of biasing the tooth during normal operation. For example, the conductive structure can have a conductance that is greater than the conductance of the material of the active region 123, but is not connected to any active components, such as a transistor, or to any input/output terminals that would be capable of driving the teeth 134 to provide a bias signal. In a particular embodiment, the teeth of a grate can be electrically connected together, or electrically isolated from each other. In contrast, the term "active tooth" is intended to refer to a structure that is electrically connected to an interconnect structure that is capable of being actively driven to a desired voltage, such as ground, or to otherwise provide a bias signal to the tooth. The passive nature of the teeth disclosed herein is illustrated the figures by the label "z". In other embodiments the teeth may be actively driven.

In the plan view of FIG. 3, the Gunn diode 120 is shown to have a length 102 and a width 103 as defined by the active region as bound by the dielectric region 139 and the terminals 132 and 133. The term "length" as used with respect to a Gunn diode, or its features, is intended to refer to a shortest dimension of the active region of the Gunn diode residing between the anode and cathode as measured in a length direction. The term "length direction" as used herein with respect to a Gunn diode is intended to mean the predominate direction of current flow between the cathode and anode. The term "width" as used herein with respect to a Gunn Diode, or its features, is intended to refer to a dimension of the active region of the Gunn diode that is perpendicular to the length direction of the Gunn diode.

The teeth 134 are illustrated to have a length 191, while the width of each tooth 134 has the same actual width 103 as the width of the Gunn diode 120, by virtue terminating at the isolation regions 139. Note that a tooth that terminates past the isolation regions 139 would have a larger actual width that an illustrated tooth 134, but would have the same effective width as an illustrated tooth 134, wherein the effective width is limited by the width of the active region 123. Conversely, a tooth that terminates directly over the active region 123, e.g., prior to the isolation regions 139, has a width that is less than that of the active region 123. A center location of the active region 123, represented by line 101, directly underlies a portion of the center tooth 134. As specifically illustrated, the center location of the middle tooth 134 is also represented by line 101, and therefore the tooth and the active region are commonly centered. Dimension 194 of FIG. 3 represents the grate period, which is the distance between adjacent teeth 134 of the grate 130. Dimension 192 of FIG. 3 represents the distance from the cathode to the center of a closest tooth 134. Dimension 193 of FIG. 3 represents the distance from the anode 133 to the center of a closest tooth 134.

Figure 4:
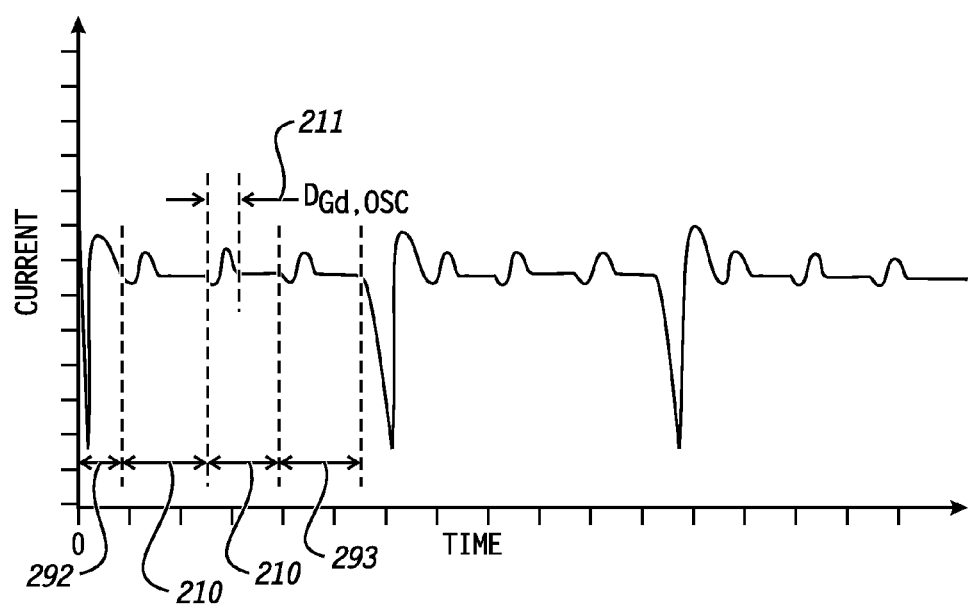
FIG. 4 illustrates a time-current graph of a Gunn diode of FIG. 2.

FIG. 4 is a current-time graph illustrating the operation of Gunn diode 120. In particular, it has been discovered that in addition to the normal Gunn oscillation, an additional modulation occurs during Gunn domain transit that is based upon a characteristic of the overlying conductive layer (e.g., the number of teeth 134 overlying the active region 123). In particular, a number of cycles of the secondary oscillation occurring during each normal Gunn oscillation cycle is equal in number to the number of teeth 134 in the grate 130. Thus, the three-tooth grate of FIG. 3 produces the three oscillation cycles illustrated at FIG. 4, wherein each one of the three oscillation cycles are associated with one of three oscillation cycles and one of the three teeth 134 of grate 130.

The secondary oscillation illustrate at FIG. 4 is referred to herein as the Grate oscillation of the Gunn diode. The period of time 294 from the start of one secondary oscillation to the start of an adjacent secondary oscillation is based upon the distance between adjacent gates, e.g., the period of the grate, and can be referred to herein as the grate oscillation period of the Gunn diode ($P_{Gg,osc}$). The period of time 293 of the secondary oscillation is based upon the distance from the last gate 134 and the anode 133. The period of time 292 is passed upon the distance from the cathode 132 and the first gate 134.

A duration 211 represents the duration of the domain of the secondary oscillation, e.g., that portion of $P_{Gg,osc}$ during which the secondary oscillation is actively transitioning. This duration can be referred to herein as $D_{Gg,osc}$.

It will be appreciated that when the teeth 134 of grate 130 are periodic, the duration 294 will be based upon the distance between adjacent teeth, e.g., distance 194. Thus, in FIG. 4, the first secondary oscillation is associated with the two teeth 134 closest the cathode 132, and the second secondary oscillation is associated with the two teeth 134 furthest from cathode 132. The duration 214 associated with these two oscillation periods can be generally characterized by the equation:

$$P_{Gg,osc} = (P_{Gd,osc}/n_{gt}) * (P_g * (n_{gt}-1))/G_L$$

Where:
$P_{Gd,osc}$—is the period of the normal Gunn oscillation; and
$n_{gt}$ is the number of teeth in the grate.
$P_g * (n_{gt}-1)$ is the distance from the first tooth to the last tooth of the grate; where
$P_g$ is the tooth period of the grate (e.g., 194)
$n_g$ is the number of teeth in the grate; and
$G_L$ is the length of the Gun Diode.

The duration 293 of third secondary oscillation, however, is based upon the distance 193 from the last tooth 134, e.g., the tooth furthest from cathode 132, to the anode 133. Similarly the duration 292 from the start of the normal Gunn oscillation until the start of the first grate oscillation is based upon the distance 192, which is the distance from the cathode to the first tooth 134

Figure 5:
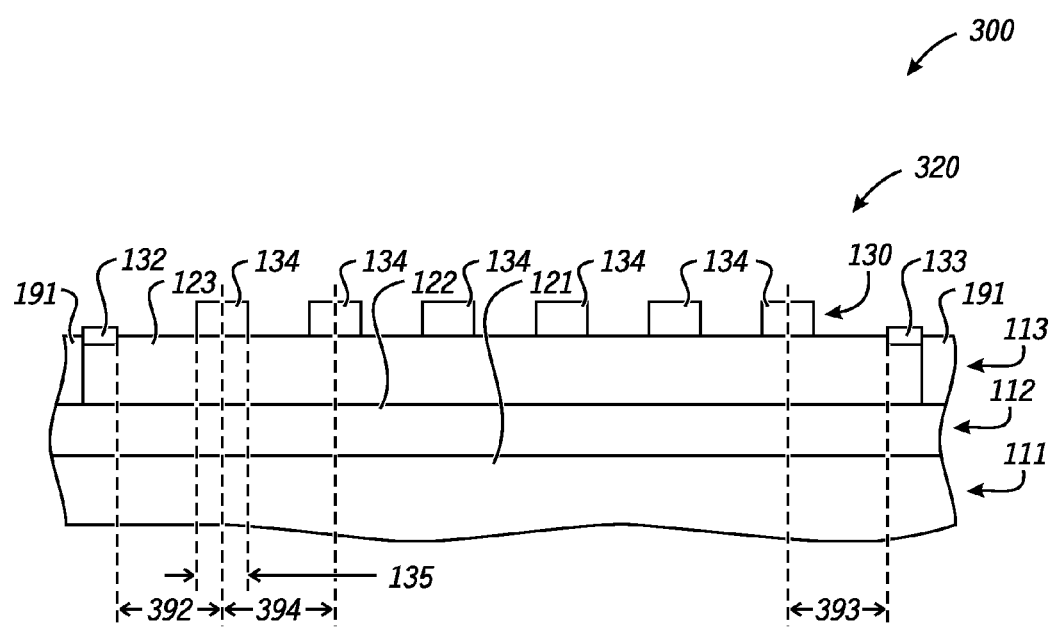
FIG. 5 illustrates a cross-sectional view of a Gunn diode in accordance with a particular embodiment of the present disclosure.

FIG. 5 illustrates a cross-sectional view of a workpiece 300 that includes an embodiment of a Gunn diode 320 having a grate with six (6) teeth 334. Gunn diode 320 of FIG. 5 has a length 102, which is the same length as Gunn diode 120 of FIGS. 2 and 3. The period 314 of adjacent teeth 334 is approximately one-half the period 194 of adjacent teeth 134 of FIGS. 2 and 3. Features of workpiece 300 that are presumed to be the same as those previously described with reference to workpiece 100 are identically numbered.

Figure 6:
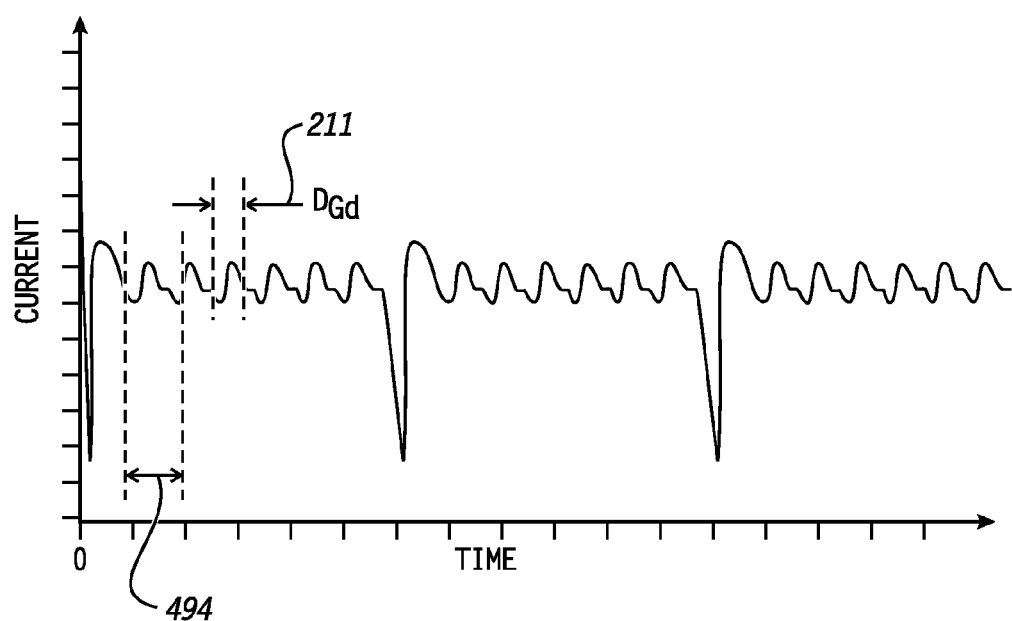
FIG. 6 illustrates a time-current graph of the Gunn diode of FIG. 5.

Because the Gunn diode 320 has six (6) teeth, its current-time graph, illustrated at FIG. 6, shows a corresponding six (6) secondary oscillations occurring during each Normal Gunn oscillation period. The period 314 of the grate oscillation for Gunn diode 320, however, is substantially shorter than the oscillation of Gunn diode 120 by virtue of the tooth period 314 of Gunn diode 320 being shorter than the tooth period 194 of Gunn diode 120. For clarity of illustration, it is presumed that the distance 392 from the cathode 132 to the first tooth 334 is sufficiently long so that the first grate oscillation does not overlap with the Gunn domain. Thus, the duration from when the Gunn domain is generated until the Gunn domain reaches the first grate is greater than $D_{Gd}$ (FIG. 1). It will be appreciated, that in an alternate embodiment, the six (6) oscillations could be more equally spaced across the entire Normal Gunn oscillation period, which would result in the first grate oscillation and the signal of the Gunn domain occurring concurrently.

Figure 7:
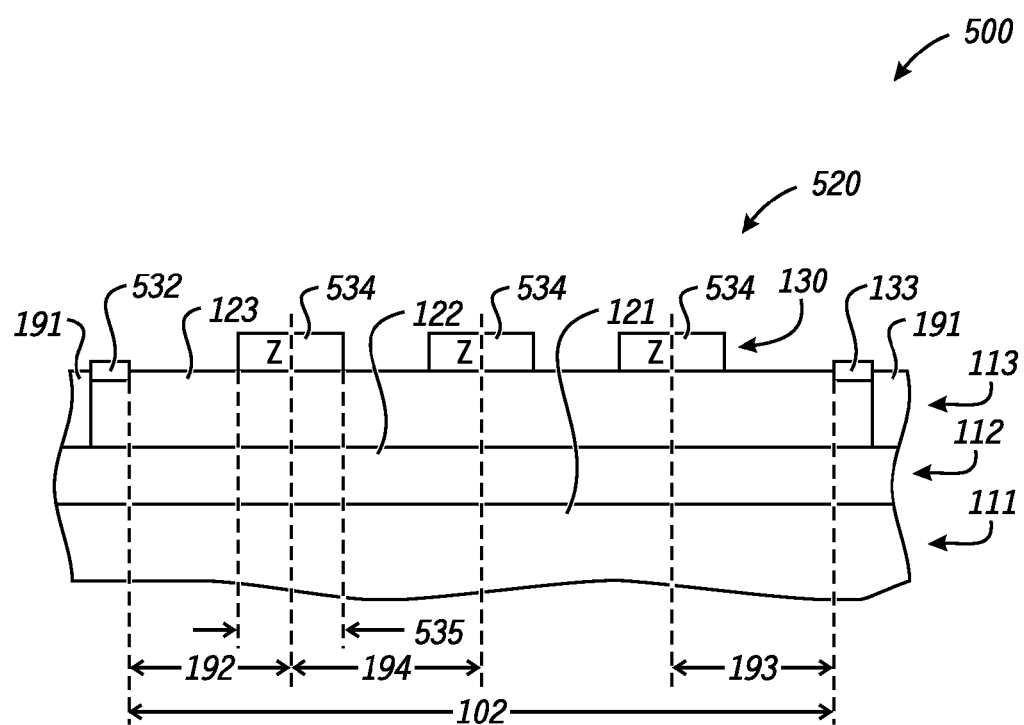
FIG. 7 illustrates a cross-sectional view of a Gunn diode in accordance with a particular embodiment of the present disclosure.

FIG. 7 illustrates a cross-sectional view of another embodiment of a Gunn diode 520 having a grate with three (3) teeth 534. Gunn diode 520 of FIG. 7 has the same length as Gunn diodes 120 and 320. The period of adjacent teeth 434 is dimension 194, which is the same as Gunn diode 120, which also has three (3) teeth. The length 491 of teeth 534 is approximately twice the length 191 of the teeth 134 of Gunn diode 120. Features of workpiece 500 presumed to be the same as those previously described with reference to workpiece 100 of FIG. 1 are identically numbered.

Figure 8:
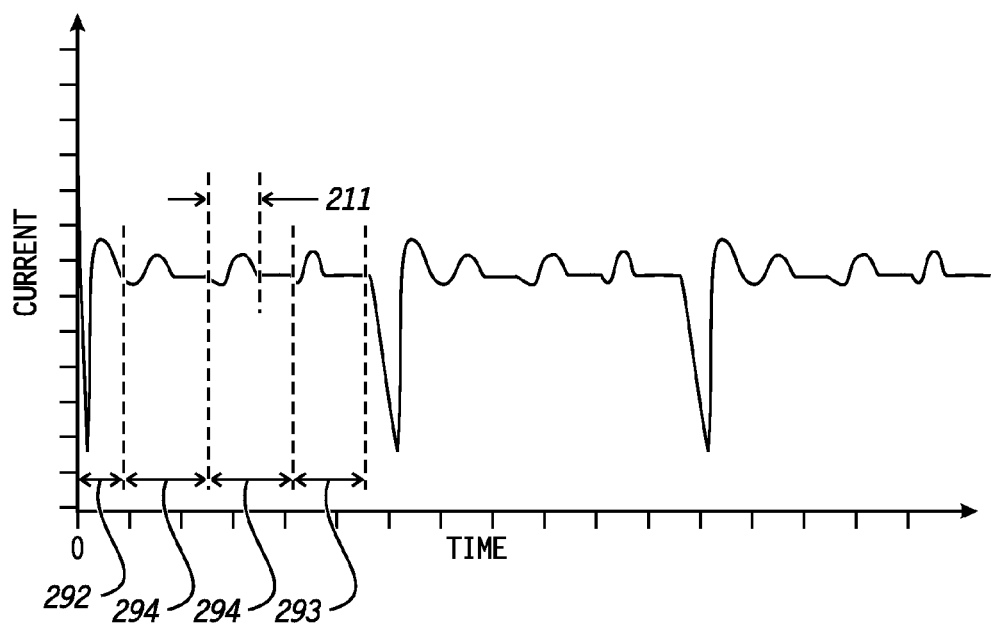
FIG. 8 illustrates a time-current graph of the Gunn diode of FIG. 7.

Because the Gunn diode 520 has three (3) teeth 434, its current-time graph, illustrated at FIG. 8, shows three (3) corresponding secondary oscillations that occur during a normal Gunn oscillation period. The period of the grate oscillation for Gunn diode 420 is substantially the same as for Gunn diode 320. However, while teeth having a greater length do not substantially change the duration of $P_{Gg,osc}$, the harmonic components of each oscillation is believed to change. In particular, a Gunn diode having a grate with longer teeth, but the same period as a Gunn diode having the same grate with shorter teeth, is understood to result in a secondary oscillation having a fundamental frequency with relatively more power than its harmonic frequencies. This results in the secondary oscillation being less "spikey", e.g., more sinusoidal, when teeth with a greater length are used. Thus, in applications where it is desirable to work with the highest possible frequency of the Gunn diode's grate oscillation a shorter tooth length may be desirable, as the result will be grate oscillations that have more significant higher order harmonics, e.g., the oscillations are more "spikey". Conversely, in applications where it is desirable to work directly with the fundamental frequency of the secondary signal, a Gunn Diode having a longer tooth length could be desirable, as the result will be a first harmonic with a higher power component.

After reading the specification, skilled artisans will appreciate that certain features are, for clarity, described herein in the context of various embodiments, and that there are other embodiment and details.

For example conductive features, such as teeth 134, can be considered conductive by virtue of having at least a portion that is more conductive than the active region 123, for example, or by virtue of having a portion that is more conductive than a material that resides between conductive features 134. For example, the conductive features 134 can be more conductive than active region 123 by at least an order of magnitude, and more conductive than the material between the conductive features, where the material between the conductive features 134 can be either less conductive or more conductive than active region 123; the conductive features 134 can be less conductive than active region 123, but more conductive than the material between conductive features 134.

In addition, the number of location of the conductive teeth can vary. For example, more or fewer teeth can be used, included a single tooth. The length of a tooth can vary significantly. For example, where a single tooth is formed overlying the active region the tooth can have a length that is from near zero percent of the length of the active region to a length that is near 100 percent of the length of the active region. Other ranges for the length of a tooth include: between 5000 nm and 50 nm; between 2500 and 50 nm; between 1250 and 50 nm; between 600 and 50 nm; between 300 and 50 nm; between 100 and 50 nm; between 1250 nm and 500 nm.

Figure 9:
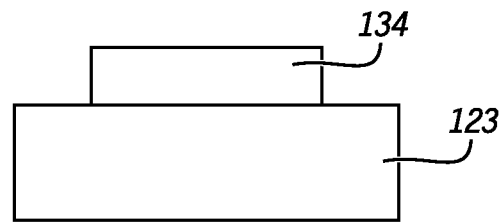
FIG. 9 illustrates a cross sectional view of particular embodiment of a portion of a Gunn diode in accordance with a particular embodiment of the present disclosure.
Figure 10:
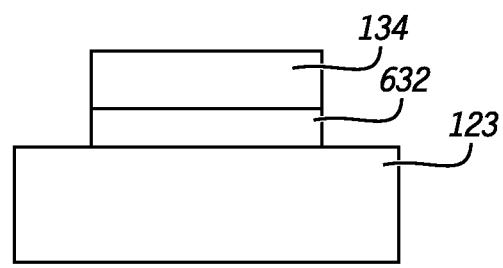
FIG. 10 illustrates a cross sectional view of particular embodiment of a portion of a Gunn diode in accordance with a particular embodiment of the present disclosure.

In addition, it will be appreciated that the manner and materials used to form the conductive structures can vary to incorporate any one of various embodiments. FIG. 9 illustrates a specific embodiment of a conductive tooth 134 that directly abuts the active region 123. For example, a metal layer, a doped poly-silicon layer, or other conductive layer can be formed directly at the surface of active region 123. Alternatively, as illustrated at FIG. 10, a conductive tooth 134 is spaced apart from the active region by a less conductive layer 682, e.g., a dielectric layer 682. It will be appreciated that the dielectric portion needs have sufficiently small thickness dimension to ensure the conductive tooth 134 is close enough to the active region 123 to effectuate the secondary oscillation described herein. For example, the thickness of the dielectric portion 182 can be 2500 Angstroms or less. In addition, after formation of the teeth 134, a dielectric material (not shown) can be formed over the active region 123 and tooth 134, wherein the dielectric material would reside between adjacent teeth of the device.

Figure 11:
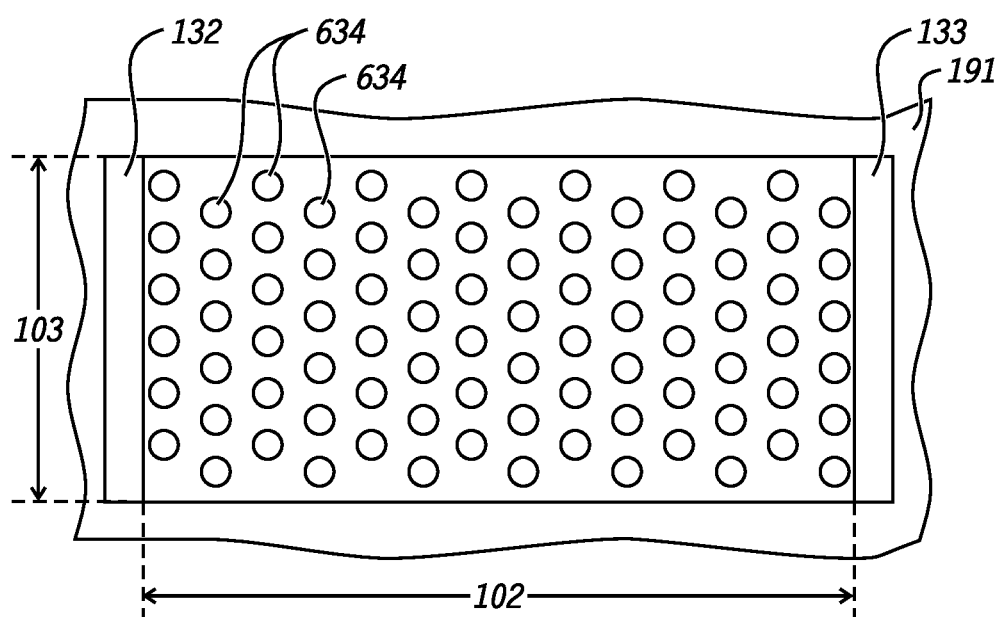
FIG. 11 illustrates a plan view of a Gunn diode in accordance with a particular embodiment of the present disclosure.

In addition, it will be appreciated that conductive structures other than the grate specifically described can be used. For example, a conductive structure can be a meta-material having a plurality of features overlying the active region that are isolated from each other. For example, FIG. 11 illustrates a meta-material formed by a plurality of circular conductive features 634 that are arranged in an offset array pattern. It will be appreciated that other meta-materials can be used that may or may not be organized in arrays, and have feature that are the same or different than those illustrated at FIG. 11.

Figure 12:
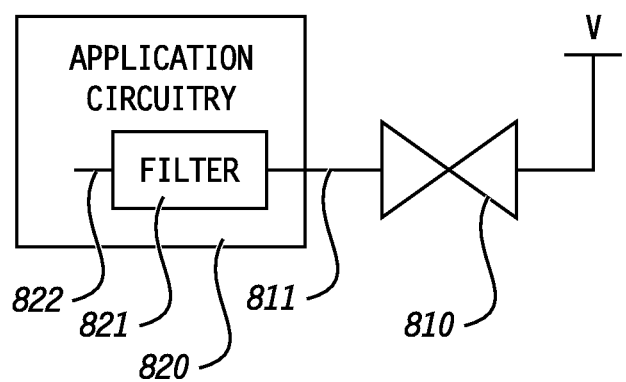
FIG. 12 illustrates in block diagram form a system device implementing a Gunn diode in accordance with a particular embodiment of the present disclosure.

FIG. 12 illustrates a system device for implementing a particular application using a Gunn diode in accordance as described herein. In particular, the system of FIG. 12 includes a Gunn diode 810, application circuitry 820, and a voltage reference terminal, labeled "V". For convenience, a label or reference numeral associated with a particular node or terminal can also be used to refer to a signal present at that node. Therefore, it will be appreciated that cathode of the Gunn diode 810 is connected to the voltage reference terminal labeled V, which during operation provides a voltage V having sufficient magnitude to effectuate generation of a Gunn domain as described above." The anode of the Gunn transistor 810 is connected to a node 811 that is also connected to application circuitry 820.

The application circuitry 820 includes filter circuitry 821 and is associated with implementing a particular application based on the secondary signal received from the Gunn diode 810. According to an embodiment, filter circuitry 812 is connected to the input node 811 to receive the signal generated by the Gunn diode 810, which includes the normal Gunn oscillation and the secondary oscillation described herein. During operation, filter 820 can filter the received signal and provide a filtered signal at its output, which is connected to node 822. Node 822 can be connected to other circuits of the application circuitry 820, such as other filters, amplifiers, mixers, switches, and data processor devices that are used to implement a particular application. A typical frequency used in such an application is in excess of 1 GHz, and can include frequencies that are greater than the fundamental frequency of the normal Gunn oscillation. For example, it is anticipated that frequencies in excess of 100 GHz can be realized, such as frequencies up to 150 GHz, 200 GHz, or more.

In accordance with an embodiment, the filtered signal provided by filter 821 for use by the application circuitry 820 is based upon the secondary oscillation. For example, the filter 821 can provide one or more of the fundamental or harmonic frequencies of the secondary signal for use by a specific application. In another embodiment, the filter 821 can attenuates one or more of the fundamental or harmonic frequencies of the normal Gunn oscillation signal.

As used herein, a particular frequency of signal from the diode 810 is said to be "associated with the secondary signal but not the normal Gunn diode oscillation" if the amount of energy of the secondary signal from the Gunn diode at that frequency is greater than the amount of energy of the normal Gunn diode oscillation at that frequency. Similarly, a particular frequency of signal from the diode 810 is said to be "associated with the normal Gunn oscillation but not the secondary signal" if the amount of energy at the particular frequency is greater in the normal Gunn diode oscillation than in the secondary oscillation. It will be appreciated that whether a particular signal is associated with the secondary signal can be further limited by a relative difference in power of the particular frequency. For example, whether a particular frequency is associated with one signal but not the other can be qualified by an amount. For example, a particular frequency can be said to be associated with the secondary signal but not the normal Gunn oscillation signal in response to the particular frequency of secondary signal having some greater amount of energy than does that particular frequency at the normal Gunn oscillation. For example, the amount of energy can be a relative difference, such as at least 3 dB, 6 dB, 9 db, 10 db, or more.

It will be appreciated therefore, that the application implemented by application circuitry 820 may be designed to use the fundamental and harmonic frequency characteristics of the secondary oscillation, as opposed to using the fundamental and harmonic frequency characteristics of the normal Gunn oscillation. For example, the application circuitry may be designed to use the higher fundamental frequency of the secondary signal, wherein the fundamental frequency of the normal Gunn diode oscillation is attenuated, e.g., by an amount as listed above. Another reason an application may designed to use a frequency associated with the secondary signal would be because the Gunn Diode is designed to generate a secondary oscillation that is more sinusoidal than the normal Gunn oscillation.

It will be further appreciated that the application circuitry 820 can include circuitry to implement an oscillator, a microwave source, and the like. In other embodiments, in addition to implementing an oscillator or microwave, the resulting oscillations or microwaves can be used in a variety of applications. Examples of such applications include: intrusion alarms, radars, microwave test equipment; power applications; airborne collision avoidance systems; sensors for monitoring flow of traffic; car radar detectors; traffic signal controllers; automatic door opener; automatic traffic gates; speed sensors; anti-lock brakes; motion detectors; and the like.

It will be appreciated that real-space charge-transfer devices, such as the described Gunn Diode, may include features other than those illustrated. For example, a region of the active region near the anode may have a lower doping level than the other portions of the active region to facilitate initiation of the Gunn domain. Other real-space charge-transfer devices can include conductive features as described herein, such as IMPATT diodes (IMPact ionization Avalanche Transit-Time diode), and a Read diodes.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" are employed to describe elements and components described herein. This is done merely for convenience and to give a general sense of the scope of the invention. This description should be read to include one or at least one and the singular also includes the plural unless it is obvious that it is meant otherwise.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A device comprising:
a real-space charge-transfer device comprising
a first anode/cathode terminal spaced apart by a first instance from a second anode/cathode terminal;
a semiconductor region coupled to the first and second anode/cathode, wherein current is to flow between the first anode/cathode terminal and the second anode/cathode terminal through the semiconductor region; and
a conductive structure overlying the semiconductor region, the conductive structure being spaced apart from the semiconductor region by less than 2500 Angstroms and having a conductivity that is greater than the conductivity of the semiconductor region; and
a filter comprising an input coupled to the second anode/cathode terminal, and an output, the filter configured to selectively pass a frequency component provided by the real-space charge-transfer device during operation that is based upon a characteristic of the conductive structure.

2. The device of claim 1, wherein the entire length of the semiconductor region is n-doped.

3. The device of claim 1, wherein the conductive structure comprises a number of repetitive features, and the characteristic of the conductive structure is the number of features.

4. The device of claim 1, wherein the conductive structure comprises a first conductive tooth overlying a portion of the semiconductor region, a length of the conductive tooth being less than a length of the real-space charge-transfer device, and the characteristic of the conductive structure includes the length of the conductive tooth.

5. The device of claim 4, wherein the conductive structure further comprises a grate comprising a plurality of conductive teeth that includes the first conductive tooth, and the characteristic of the conductive structure further comprises the number of teeth of the grate.

6. The device of claim 1, wherein the plurality of repetitive features is a two-dimensional array of the features.

7. The device of claim 1, wherein the conductive structure is a passive conductive structure.

8. A method of generating a signal comprising:
applying a voltage across a semiconductor region of a real-space charge-transfer device;
generating, in response to the voltage, a normal real-space charge-transfer signal at the semiconductor region, the normal real-space charge-transfer signal having a first fundamental frequency; and
generating, in response to the voltage, a secondary signal at the compound semiconductor region concurrently with the normal real-space charge-transfer signal, the secondary signal having a second fundamental frequency that is greater than the first fundamental frequency;
receiving the normal real-space charge-transfer signal and the secondary signal at a filter;
filtering the input signal to produce an application signal that oscillates at a frequency associated with the secondary signal.

9. The method of claim 8, wherein the application signal includes the second fundamental frequency of the secondary signal.

10. The method of claim 9, wherein the application signal does not include the first fundamental frequency of the normal real-space charge-transfer signal.

11. The method of claim 8, wherein the application signal includes a harmonic of the fundamental frequency of the secondary signal.

12. The method of claim 8, wherein the second fundamental frequency is based upon a characteristic of a conductive structure overlying the compound semiconductor region.

13. The method of claim 12, wherein the characteristic is a number of conductive features of the conductive structure overlying the semiconductor region.

14. The method of claim 13, wherein the characteristic is a spacing of individual conductive features of the conductive structure.

15. The method of claim 12, wherein the characteristic is a number of conductive features of the conductive structure overlying the semiconductor region, and a spacing between the conductive features.

16. The method of claim 12, wherein the structure is a grate.

17. The method of claim 16, wherein the grate is periodic.

18. The method of claim 12, wherein the structure is an array.

19. The method of claim 8, wherein the structure is spaced apart from the compound semiconductor region by less than 2500 Angstroms.

20. A method of manufacturing a real-space charge transfer device comprising:

providing a substrate having planar active region disposed between a cathode and an anode, the planar active region having a length defined by a dimension between the cathode and the anode, and the active region being doped with an n-type dopant;

forming a conductive structure overlying the active region, wherein the conductive structure has a repetitive feature along the length of the active region, and is spaced apart from the active region by no more than 2500 Angstroms.

* * * * *